(12) United States Patent
Wang

(10) Patent No.: US 9,927,172 B2
(45) Date of Patent: Mar. 27, 2018

(54) VACUUM DRYING APPARATUS AND VACUUM DRYING METHOD USING THE SAME

(71) Applicant: BOE Technology Group Co., Ltd., Beijing (CN)

(72) Inventor: Hao Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 247 days.

(21) Appl. No.: 14/741,611

(22) Filed: Jun. 17, 2015

(65) Prior Publication Data

US 2016/0238315 A1   Aug. 18, 2016

(30) Foreign Application Priority Data

Feb. 13, 2015   (CN) .......................... 2015 1 0079423

(51) Int. Cl.
| | |
|---|---|
| F26B 5/04 | (2006.01) |
| F26B 11/04 | (2006.01) |
| H01L 21/67 | (2006.01) |
| F26B 17/12 | (2006.01) |
| F26B 25/08 | (2006.01) |

(52) U.S. Cl.
CPC ................ *F26B 5/042* (2013.01); *F26B 5/04* (2013.01); *F26B 11/049* (2013.01); *F26B 17/128* (2013.01); *F26B 25/08* (2013.01); *H01L 21/67034* (2013.01); *H01L 21/67051* (2013.01); *H01L 2224/75102* (2013.01)

(58) Field of Classification Search
CPC .... F26B 5/00; F26B 5/042; F26B 5/04; F26B 11/049; F26B 17/128; H01L 21/00; H01L 21/67051; H01L 2224/75102
USPC ... 34/92, 107, 231, 307, 311, 402, 403, 406; 134/590, 902
See application file for complete search history.

(56) References Cited

U.S. PATENT DOCUMENTS

| | | | |
|---|---|---|---|
| 9,555,437 B2 * | 1/2017 | Nakai ................. | B05C 11/1039 |
| 2009/0084415 A1 * | 4/2009 | Nomura ............ | H01L 21/67028 |
| | | | 134/61 |
| 2011/0309360 A1 * | 12/2011 | Chesterfield .............. | F26B 5/04 |
| | | | 257/52 |

* cited by examiner

*Primary Examiner* — Kenneth Rinehart
*Assistant Examiner* — Raymond Williamson
(74) *Attorney, Agent, or Firm* — Westman, Champlin & Koehler, P.A.

(57) ABSTRACT

An embodiment of the present invention provides a vacuum drying apparatus and a vacuum drying method. The vacuum drying apparatus includes a chamber in which a substrate table is arranged, the chamber being provided with a wind deflector therein, wherein the wind deflector comprises a top opening, a bottom opening and a body part connecting the top opening with the bottom opening. During the vacuum drying, the bottom opening is in tight contact with a surface of the substrate table, and there is a gap between the top opening and the top of the chamber and a material on the substrate table is covered by the wind deflector.

20 Claims, 3 Drawing Sheets

VACUUM DRYING APPARATUS AND VACUUM DRYING METHOD USING THE SAME

CROSS-REFERENCE TO RELATED APPLICATION

This application claims the benefit of Chinese Patent Application No. 201510079423.1 filed on Feb. 13, 2015 in the State Intellectual Property Office of China, the whole disclosure of which is incorporated herein by reference.

BACKGROUND OF THE INVENTION

Field of the Invention

The present disclosure relates to the field of drying technology, in particular, relates to a vacuum drying apparatus and a vacuum drying method using the same.

Description of the Related Art

An OLED display device includes a plurality of film layers arranged in sequence on a substrate. These film layers may be formed by various means such as evaporation, ink jet printing. The ink jet has advantages of such as high utilization ratio of material, large size of printing. Thus, it is an important means for producing large size OLED display apparatus in batch.

Typically, after the ink jet printing operation has been completed, it is desired to move the substrate into a vacuum drying apparatus to be dried such that the solvent in the ink droplets is volatilized to form a film layer finally. The conventional vacuum drying apparatus is shown in FIG. 1. The vacuum drying apparatus includes a chamber 1' in which a substrate table 2' is arranged and at the bottom of which two extraction ports 3' are arranged symmetrically. The substrate 4' (called as material) is arranged on the substrate table 2'. During drying, the extraction ports 3' extract gases from the chamber 1' to reduce the pressure in the chamber 1', so as to promote the volatilizing the solvent in the ink droplets for drying.

During the drying, gas flow in the chamber 1' is directed to the extraction ports 3' from the substrate table 2'. The closer the gas flow to the extraction ports 3', the larger the speed of the gas flow becomes. It causes the speed of the gas flow at the peripheral region of the substrate 4' to be greater than that of the gas flow at the central region of the substrate 4', such that the speed of drying ink droplets at the peripheral region of the substrate 4' to be greater than that of drying ink droplets at the central region of the substrate 4'. After the ink droplets at the peripheral region of the substrate 4' have been dried, the ink droplets at the central region of the substrate 4' are still in liquid state, and thus they will flow towards the peripheral region of the substrate 4', and finally, the film layer at the peripheral region of the substrate 4' has a thickness greater than that of the film layer at the central region of the substrate 4'. It may degrade the display effects of the OLED display apparatus.

SUMMARY OF THE INVENTION

An embodiment of the present invention provides a vacuum drying apparatus and a vacuum drying method that can improve the phenomenon that the drying speed at various positions on the material is not uniform during the vacuum drying.

In view of the above, embodiments of the present invention are provided by way of examples as follows.

An embodiment of the present invention provides a vacuum drying apparatus includes a chamber in which a substrate table is arranged, the chamber being provided with a wind deflector therein, wherein the wind deflector comprises a top opening, a bottom opening and a body part connecting the top opening with the bottom opening, and wherein during the vacuum drying operation, the bottom opening is in tight contact with a surface of the substrate table, and there is a gap between the top opening and the top of the chamber and a material on the substrate table is covered by the wind deflector.

In an example, the body part of the wind deflector is a side wall connecting the top opening with the bottom opening.

In an example, the wind deflector is movable up and down.

In an example, the vacuum drying apparatus further comprises a wind deflector elevation driver connected with the wind deflector and configured to drive the wind deflector to move up and down.

In an example, the wind deflector elevation driver comprises an elevation mechanism configured to drive the wind deflector to move up and down and an elevation driving mechanism configured to drive the elevation mechanism to move up and down.

In an example, the elevation driving mechanism comprises a motor, a coupling, a lead screw, a nut and a guide shaft, and wherein the motor is connected to an end of the lead screw by the coupling, the nut being mounted around the lead screw and connected with the elevation mechanism, and wherein the elevation mechanism moves up and down in a direction of the guide shaft, the guide shaft being connected to the top of the chamber and perpendicular to the substrate table.

In an example, the elevation mechanism comprises an elevation plate and an elevation shaft, the elevation plate being connected with the nut and connected with the wind deflector by the elevation shaft passing though the top of the chamber, and wherein the elevation plate is provided with a guide hole thereon matched with the guide shaft, the elevation plate being placed idly around the guide shaft through the guide hole.

In an example, the elevation plate is connected with a guide sleeve in the guide hole, the guide sleeve being placed idly around the guide shaft.

In an example, the elevation driving mechanism comprises a cylinder and a guide shaft, the cylinder comprising a cylinder rod which has an end connected with the elevation mechanism, and wherein the elevation mechanism is movable up and down in a direction of the guide shaft, the guide shaft being connected to the top of the chamber and perpendicular to the substrate table.

In an example, the elevation mechanism comprises an elevation plate and an elevation shaft, the elevation plate being connected with the cylinder rod and connected with the wind deflector by the elevation shaft passing through the top of the chamber, and wherein the elevation plate is provided with a guide hole thereon matched with the guide shaft, the elevation plate being placed idly around the guide shaft through the guide hole.

In an example, the elevation plate is connected with a guide sleeve in the guide hole, the guide sleeve being placed idly around the guide shaft.

In an example, the elevation mechanism further comprises a retractable bellows mounted around the elevation shaft and configured to seal a region connecting the elevation plate with the top of the chamber.

In an example, the wind deflector elevation driver further comprises an elevation limit mechanism configured to limit an upper limit position and a lower limit position of the wind deflector.

In an example, the elevation limit mechanism comprises an upper limit position sensor, a lower limit position sensor and a sensor mount, the upper limit position sensor and the lower limit position sensor being fixed to the sensor mount, all of the upper limit position sensor, the lower limit position sensor and the motor being connected with a controller, and wherein the controller is configured to control the work state of the motor on the basis of the signals transmitted from the upper limit position sensor and/or the lower limit position sensor.

In an example, the side wall of the wind deflector is at an angle less than or equal to 90 degrees with respect to the surface of the substrate table.

In an example, the wind deflector has a square or circular cross section parallel to the bottom opening.

In an example, the material is substrate of an OLED display device which has been processed by an ink jet printing, and a layer of ink droplets is formed on the substrate by the ink jet printing.

In an example, an extraction port is arranged at the bottom of the chamber or a plurality of extraction ports are distributed uniformly or in a predetermined form on the positions corresponding to the wind deflector at the bottom of the chamber.

The embodiment of the present invention provides a vacuum drying apparatus as described above. During drying operation, the bottom opening of the wide deflector is in tight contact with the substrate table while leaving a gap between the top opening and the top of the chamber such that the gas flow in the wind deflector is directed from a surface of the substrate table through the top opening of the wind deflector to the external of the wind deflector and then out of the chamber. In this way, the gas flow is prevented from flowing directly out of the chamber from the substrate table. As the speed of the gas flow at various positions in the wind deflector is relatively uniform, the phenomenon that the drying speed is not uniform at various positions of the material may be suppressed.

An embodiment of the present invention also provides a vacuum drying method for drying material using the vacuum drying apparatus as described above, the method comprising:

providing the material onto the substrate table;

covering the material by the wind deflector, the bottom opening of the wind deflector being in tight contact with the substrate table, and leaving a gap between the top opening of the wind deflector and the top of the chamber; and evacuating the chamber.

The embodiment of the present invention provides a vacuum drying method for drying material using the vacuum drying apparatus as described above, to cover the material by the wind deflector. During drying operation, the bottom opening of the wide deflector is in tight contact with the substrate table while leaving a gap between the top opening of the wind deflector and the top of the chamber such that the gas flow in the wind deflector is directed from a surface of the substrate table through the top opening of the wind deflector to the external of the wind deflector and then out of the chamber. In this way, the gas flow is prevented from flowing directly out of the chamber from the substrate table.

As the speed of the gas flow at various positions in the wind deflector is relatively uniform, the phenomenon that the drying speed is not uniform at various positions of the material may be suppressed.

BRIEF DESCRIPTION OF THE DRAWINGS

The embodiments of the present invention will be more apparent after reading the following explanations for drawings. It should be noted that the following drawings are given only by way of examples. The skilled person in the art may apparently envisage other drawings from these drawings, without any creative labor.

EXPLANATION OF REFERENCE NUMERALS

Figure 1:
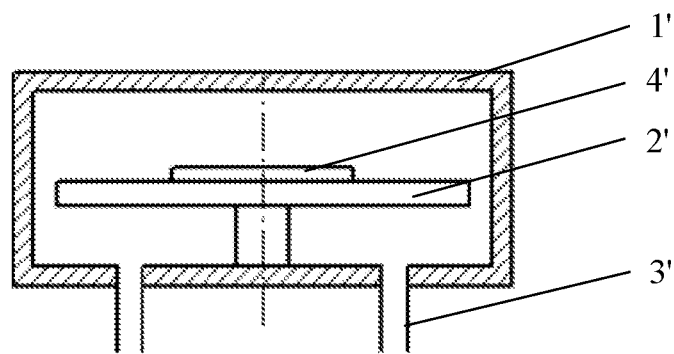
FIG. 1 schematically shows a structure of a vacuum drying apparatus in the prior art.

1: chamber
2: substrate table
3: wind deflector
31: side wall
32: top opening
33: bottom opening
4: material
51: elevation driving mechanism
511: motor
512: motor mount
513: fixing plate
514: coupling
515: lead screw
516: nut
52: elevation mechanism
521: elevation plate
522: elevation shaft
523: guide shaft
524: retractable bellows
53: elevation limit mechanism
531: upper limit position sensor
532: lower limit position sensor
533: sensor mount

DETAILED DESCRIPTION OF PREFERRED EMBODIMENTS OF THE INVENTION

Exemplary embodiments of the present disclosure will be described clearly and entirely with reference to the attached drawings. The embodiments are only given by way of examples, instead of all of embodiments of the present invention. From these embodiments, all of other embodiments that can be envisaged apparently by the skilled person in the art will fall within the scope of the present disclosure.

Figure 2:
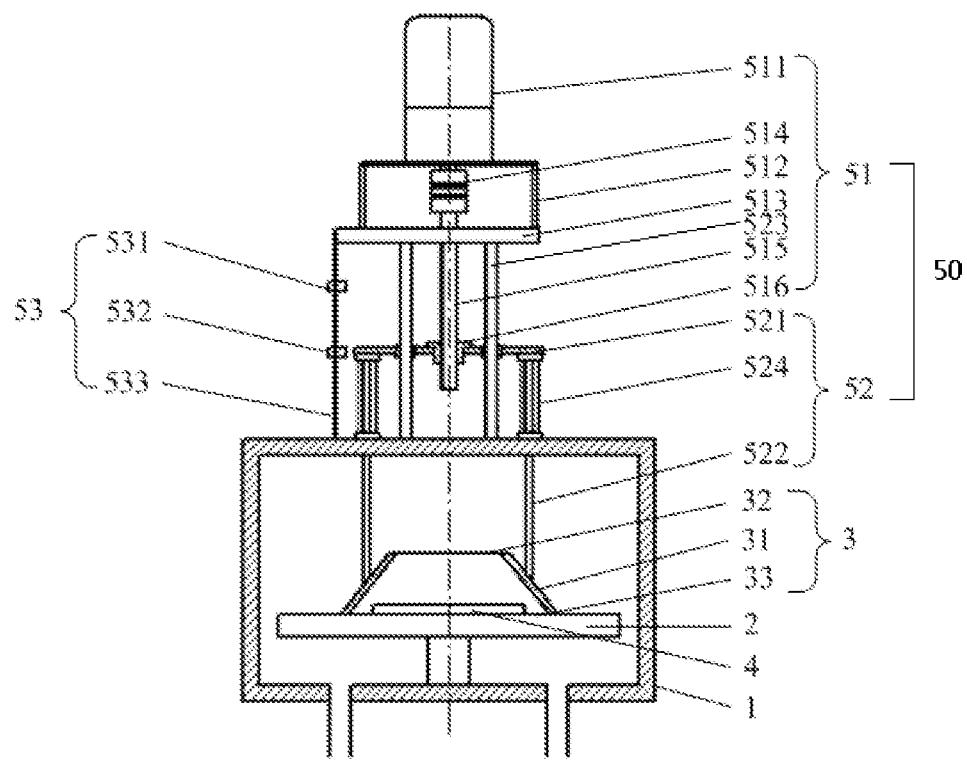
FIG. 2 schematically shows a vacuum drying apparatus according to an embodiment of the present invention, in drying operation.

An embodiment of the present invention provides a vacuum drying apparatus. As illustrated in FIG. 2, the vacuum drying apparatus includes a chamber 1. A substrate table 2 and a wind deflector 3 are arranged in the chamber 1. The wind deflector 3 includes a top opening 32, a bottom opening 33 and a body part 31 (for example, the side wall shown) connecting the top opening 32 with the bottom opening 33. During the vacuum dry, the bottom opening 33 is in tight contact with a surface of the substrate table 2, and there is a gap between the top opening 32 and the top of the chamber 1 and the material 4 is arranged in the wind deflector 3 or covered by the wind deflector 3.

FIG. 2 shows two extraction ports (not marked) arranged symmetrically at the bottom of the chamber 1. It should be understood that the skilled person in the art may envisage one extraction port is arranged at center of the bottom of the chamber 1 or a plurality of extraction ports are distributed uniformly or in a predetermined form on the positions, corresponding to the wind deflector, at the bottom of the chamber 1 so as to achieve more uniform distribution of gas flow, though FIG. 2 only shows two extraction ports. In an example, the plurality of extraction ports in form of a ring may be arranged at the bottom of the chamber 1. In the art, an arrangement of extraction ports in a certain predetermined form of distribution may be obtained by such as simulations or experiments to achieve optimum distribution of gas flow.

In particular, in an example, the material 4 is a substrate of an OLED display device which has been processed by the ink jet printing. As an example, a layer of ink droplets is formed on the substrate by the ink jet printing. By means of the vacuum drying apparatus according to the present disclosure, the solvent in the ink droplets on the substrate may be volatized to finally form various film layers for the OLED display device.

The embodiment of the present invention provides a vacuum drying apparatus as described above. During drying operation, the bottom opening of the wind deflector is in tight contact with the substrate table while leaving a gap between the top opening and the top of the chamber such that the gas flow in the wind deflector is directed from a surface of the substrate table through the top opening of the wind deflector to the external of the wind deflector and then out of the chamber. In this way, the gas flow is prevented from flowing directly out of the chamber from the substrate table. As the speed of the gas flow at various positions in the wind deflector is relatively uniform, the phenomenon that the drying speed is not uniform at various positions of the material may be suppressed.

In order to place the material 4 in the wind deflector 3, preferably, the wind deflector 3 may be movable up and down. The wind deflector 3 may be elevated manually. In order to improve the elevation speed and accuracy of the wind deflector 3, preferably, the wind deflector 3 may be elevated automatically.

When the wind deflector 3 is elevated automatically, the vacuum drying apparatus includes a wind deflector elevation driver 50 connected with the wind deflector 3 and configured to drive the wind deflector 3 to move up and down.

In an example, the wind deflector elevation driver 50 includes an elevation mechanism 52 configured to drive the wind deflector 3 to move up and down and an elevation driving mechanism 51 configured to drive the elevation mechanism 52 to move up and down. Specifically, the elevation driving mechanism 51 is disposed above the elevation mechanism 52.

In order that the skilled person in the art can understand the wind deflector elevation driver 50 in the embodiment of the present invention more clearly, the embodiment of the present invention provides the following two structures of the wind deflector elevation driver 50. The two structures of the wind deflector elevation driver 50 have different driving modes from each other.

In a first wind deflector elevation driver 50, the elevation driving mechanism 51 includes a motor 511, a coupling 514, a lead screw 515, a nut 516 and a guide shaft 523. The motor 511 is connected to an end of the lead screw 515 by the coupling 514, the nut 516 being mounted around the lead screw 515 and connected with the elevation mechanism 52. The elevation mechanism 52 moves up and down in a direction of the guide shaft 523. One end of the guide shaft 523 is connected to the top of the chamber 1 and perpendicular to the substrate table 2 while the other end of the guide shaft 523 is connected with a fixing plate 513. The guide shaft 523 supports the fixing plate 513 in which a through hole is arranged so as to allow the lead screw 515 to pass through. In addition, the motor 511 is fixed on the fixing plate 513 by a motor mount 512. In operation, the motor 511 drives the lead screw 515 to rotate by the coupling 514 such that the nut 516 drives the elevation mechanism 52 to move up and down.

As shown, the elevation mechanism 52 includes an elevation plate 521 and an elevation shaft 522. The elevation plate 521 is connected with the nut 516 and connected with the wind deflector 3 by the elevation shaft 522 passing though the top of the chamber 1. When the lead screw 515 rotates, the nut 516 drives the elevation plate 521 to move up and down to further drive the wind deflector 3 to move up and down.

In a further embodiment, the elevation plate 521 moves up and down in a direction of the guide shaft 523. In particular, the connecting means between the elevation plate 521 and the guide shaft 523 may be arranged such that the elevation plate 521 is provided with a guide hole (not marked) thereon matched with the guide shaft 523, the elevation plate 521 being placed idly around the guide shaft 523 through the guide hole. In order to improve the wear resistance of the elevation plate, preferably, the elevation plate 521 is connected with a guide sleeve in the guide hole, the guide sleeve being placed idly around the guide shaft 523. The guide sleeve may be made from wear-resistant metals such as copper. Such connection means results in a simple structure of the wind deflector elevation driver 50. As the elevation plate 521 is placed idly around the guide shaft 523, the guide shaft 523 may limit the rotation of the elevation plate 521 along with the lead screw while limiting the elevation direction of the elevation plate 521.

Certainly, the elevation plate 521 and the guide shaft 523 may also be connected by other means, for example, the elevation plate is provided with a T-shaped protrusion thereon while the guide shaft is provided with a guide groove thereon corresponding to the protrusion. Certainly, the guide shaft may be provided with the T-shaped protrusion thereon while the elevation plate may be provided with the guide groove thereon corresponding to the protrusion. The T-shaped protrusion and the guide groove cooperate with each other and slide with respect to each other such that the elevation plate moves up and down in the direction of the guide shaft. They may also limit the rotation of the elevation plate along with the lead screw.

In a second wind deflector elevation driver 50, the elevation driving mechanism includes a cylinder and a guide shaft. The cylinder includes a cylinder rod which has an end connected with the elevation mechanism. The elevation mechanism is movable up and down in a direction of the guide shaft. One end of the guide shaft is connected to the top of the chamber and perpendicular to the substrate table while the other end of the guide shaft is connected to the fixing plate. The guide shaft supports the fixing plate in which a through hole is arranged to allow the cylinder rod to pass through. In addition, the cylinder is fixed on the fixing plate by a cylinder mount. When the cylinder works, the cylinder rod drives the elevation mechanism to move up and down.

In this case, the elevation mechanism includes an elevation plate and an elevation shaft, the elevation plate being connected with the cylinder rod and connected with the wind deflector by the elevation shaft passing through the top of the chamber. When the cylinder rod moves up and down, it drives the elevation plate to move up and down.

In addition, the connecting means between the elevation plate and the guide shaft is same to that in the first wind deflector elevation driver 50. For example, the elevation plate is provided with a guide hole thereon matched with the guide shaft, the elevation plate being placed idly around the guide shaft through the guide hole.

It should be noted that the skill person in the art can also acquire other available means apparently on the basis of the above two wind deflector elevation driver 50. The detailed description will be omitted herein.

In a further embodiment, in consideration of the elevation shaft 522 passing through the top of the chamber 1, in order to prevent the elevation shaft 522 from reducing the vacuum degree in the chamber 1 during the movement or elevation, preferably, the elevation mechanism 52 may further include a retractable bellows 524 mounted around the elevation shaft 522 and configured to hermetically connect the elevation plate 521 with the top of the chamber 1. When the elevation shaft 522 moves up and down, the retractable bellows 524 extends or retracts along with it and seals a region connecting the elevation plate 521 with the top of the chamber 1 so as to avoid reduction of the vacuum degree in the chamber 1.

Figure 3:
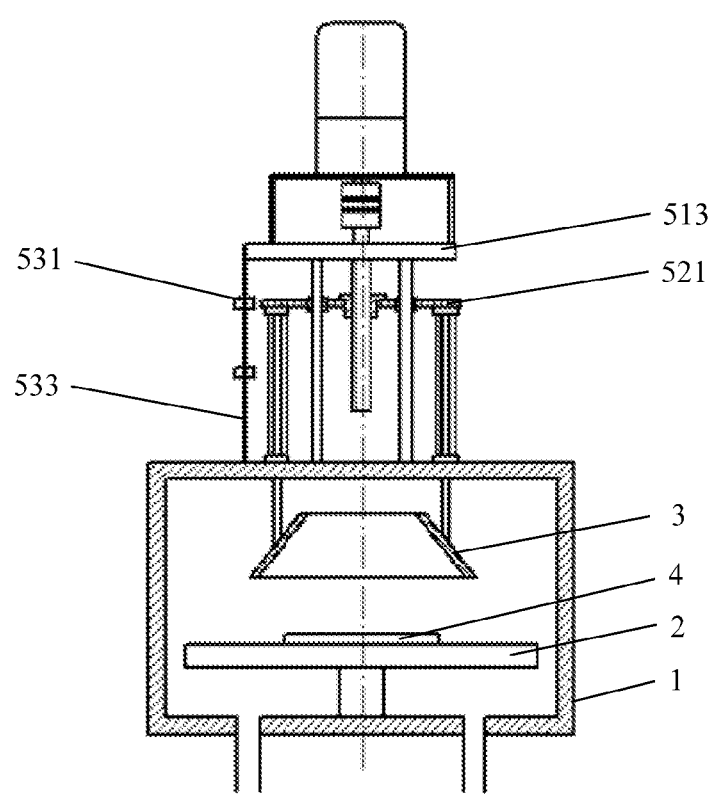
FIG. 3 schematically shows a vacuum drying apparatus according to an embodiment of the present invention, in non-drying operation.

In addition, the wind deflector elevation driver 50 further includes an elevation limit mechanism 53 configured to limit an upper limit position and a lower limit position of the wind deflector 3. As illustrated in FIG. 3, when the wind deflector 3 is raised to the upper limit position, the wind deflector 3 departs from the substrate table 2. At that time, the material 4 may be placed on the substrate table 2. As illustrated in FIG. 2, when the wind deflector 3 is lowered to the lower limit position, the bottom opening 33 of the wind deflector 3 comes into tight contact with the substrate table 2. At that time, the chamber 1 may be evacuated to dry the material 4.

In an example, the elevation limit mechanism 53 includes an upper limit position sensor 531, a lower limit position sensor 532 and a sensor mount 533, the upper limit position sensor 531 and the lower limit position sensor 532 being fixed to the sensor mount 533. As illustrated in FIG. 3, the sensor mount 533 is fixed between the fixing plate 513 and the top of the chamber 1. The upper limit position sensor 531 corresponds to the highest position of the elevation plate 521 to limit the upper limit position of the wind deflector 3. As illustrated in FIG. 2, the lower limit position sensor 532 corresponds to the lowest position of the elevation plate 521 to limit the lower limit position of the wind deflector 3.

All of the upper limit position sensor 531, the lower limit position sensor 532 and the motor 511 are connected with a controller. The controller is configured to control the work state of the motor 511 on the basis of the signals transmitted from the upper limit position sensor 531 and/or the lower limit position sensor 532. When the wind deflector 3 reaches the upper limit position, the upper limit position sensor 531 transmits a signal to the controller and the controller controls the motor 511 to stop working. When the wind deflector 3 reaches the lower limit position, the lower limit position sensor 532 transmits a signal to the controller and the controller controls the motor 511 to stop working.

In order to achieve uniform speed of gas flow in the wind deflector 3, the side wall 31 of the wind deflector 3 is at an angle less than or equal to 90 degrees with respect to the surface of the substrate table 2. When the side wall 31 of the wind deflector 3 is at an angle equal to 90 degrees with respect to the surface of the substrate table 2, the wind deflector 3 has a shape of cylinder and has a simple production process. When the side wall 31 of the wind deflector 3 is at an angle less than 90 degrees with respect to the surface of the substrate table 2, the size of the top opening 32 is less than that of the bottom opening 33, which may enable the speed of the gas flow in the wind deflector 3 to become more uniform.

Figure 4:
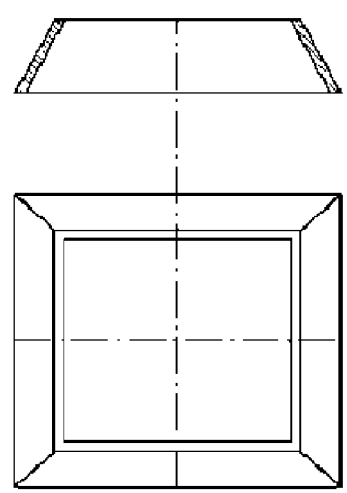
FIG. 4 is a schematic cross sectional view of a wind deflector in the vacuum drying apparatus according to an embodiment of the present invention.
Figure 5:
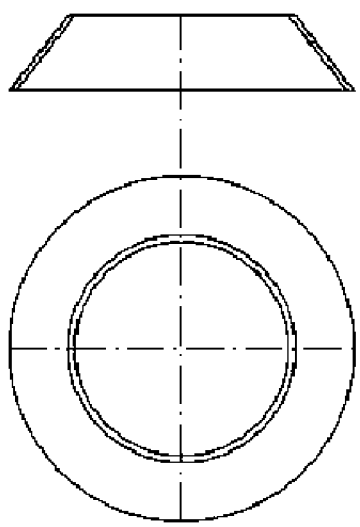
FIG. 5 is a schematic cross sectional view of another wind deflector in the vacuum drying apparatus according to an embodiment of the present invention.

Preferably, as illustrated in FIGS. 4-5, the wind deflector 3 has a square or circular cross section parallel to the bottom opening 33. In this case, the process for producing the wind deflector 3 becomes relatively simple. Certainly, the shape of the wind deflector 3 may also be other shape such that the wind deflector 3 is adapted to the shape of the material 4 or the speed of the gas flow in the wind deflector 3 becomes more uniform.

An embodiment of the present invention also provides a vacuum drying method for drying the material 4 using the vacuum drying apparatus as described above, as illustrated in FIGS. 2 and 3. The vacuum drying method includes: providing the material 4 onto the substrate table 2; covering the material 4 by the wind deflector 3, the bottom opening 33 of the wind deflector 3 being in tight contact with the substrate table 2, and leaving a gap between the top opening 32 of the wind deflector 3 and the top of the chamber 1; and evacuating the chamber 1.

It should be noted that before the material 4 is placed on the substrate table 2, the wind deflector 3 may be raised at first, and the wind deflector 3 will not be lowered until the material 4 has been placed on the substrate table 2 such that the bottom opening 33 of the wind deflector 3 comes into tight contact with the substrate table 2 and the wind deflector 3 covers the material 4.

The embodiment of the present invention provides a vacuum drying method for drying the material using the vacuum drying apparatus as described above, to cover the material by the wind deflector. During drying operation, the bottom opening of the wide deflector is in tight contact with the substrate table while leaving a gap between the top opening and the top of the chamber such that the gas flow in the wind deflector is directed from a surface of the substrate table through the top opening of the wind deflector to the external of the wind deflector and then out of the chamber. In this way, the gas flow is prevented from flowing directly out of the chamber from the substrate table. As the speed of the gas flow at various positions in the wind deflector is relatively uniform, the phenomenon that the drying speed is not uniform at various positions of the material may be suppressed.

Although several exemplary embodiments have been shown and described, the present invention is not limited to those and it would be appreciated by those skilled in the art that various changes, equivalents or modifications may be made to these embodiments without departing from the principles and spirit of the disclosure, the scope of which is defined in the claims and their equivalents.

What is claimed is:

1. A vacuum drying apparatus comprising a chamber in which a substrate table is arranged, the chamber being provided with a wind deflector therein, wherein the wind deflector comprises a top opening, a bottom opening and a body part connecting the top opening with the bottom opening, and a material on the substrate table is covered by the wind deflector,
wherein during the vacuum drying operation, the bottom opening is in contact with a surface of the substrate table, and there is a gap between the top opening and the top of the chamber such that a gas flow in the wind deflector is directed from the surface of the substrate table through the top opening of the wind deflector to external of the wind deflector and then out of the chamber.

2. The vacuum drying apparatus according to claim 1, wherein the body part of the wind deflector is a side wall connecting the top opening with the bottom opening.

3. The vacuum drying apparatus according to claim 1, wherein the wind deflector is movable up and down.

4. The vacuum drying apparatus according to claim 3, further comprising a wind deflector elevation driver connected with the wind deflector and configured to drive the wind deflector to move up and down.

5. The vacuum drying apparatus according to claim 4, wherein the wind deflector elevation driver comprises an elevation mechanism configured to drive the wind deflector to move up and down and an elevation driving mechanism configured to drive the elevation mechanism to move up and down.

6. The vacuum drying apparatus according to claim 5, wherein the elevation driving mechanism comprises a motor, a coupling, a lead screw, a nut and a guide shaft, and wherein the motor is connected to an end of the lead screw by the coupling, the nut being mounted around the lead screw and connected with the elevation mechanism, and wherein the elevation mechanism moves up and down in a direction of the guide shaft, the guide shaft being connected to the top of the chamber and perpendicular to the substrate table.

7. The vacuum drying apparatus according to claim 6, wherein the elevation mechanism comprises an elevation plate and an elevation shaft, the elevation plate being connected with the nut and connected with the wind deflector by the elevation shaft passing through the top of the chamber, and wherein the elevation plate is provided with a guide hole thereon matched with the guide shaft, the elevation plate being placed idly around the guide shaft through the guide hole.

8. The vacuum drying apparatus according to claim 7, wherein the elevation plate is connected with a guide sleeve in the guide hole, the guide sleeve being placed around the guide shaft.

9. The vacuum drying apparatus according to claim 5, wherein the elevation driving mechanism comprises a cylinder and a guide shaft, the cylinder comprising a cylinder rod which has an end connected with the elevation mechanism, and wherein the elevation mechanism is movable up and down in a direction of the guide shaft, the guide shaft being connected to the top of the chamber and perpendicular to the substrate table.

10. The vacuum drying apparatus according to claim 9, wherein the elevation mechanism comprises an elevation plate and an elevation shaft, the elevation plate being connected with the cylinder rod and connected with the wind detector by the elevation shaft passing through the top of the chamber, and wherein the elevation plate is provided with a guide hole thereon matched with the guide shaft, the elevation plate being placed idly around the guide shaft through the guide hole.

11. The vacuum drying apparatus according to claim 10, wherein the elevation plate is connected with a guide sleeve in the guide hole, the guide sleeve being placed idly around the guide shaft.

12. The vacuum drying apparatus according to claim 7, wherein the elevation mechanism further comprises a retractable bellows mounted around the elevation shaft and configured to seal a region connecting the elevation plate with the top of the chamber.

13. The vacuum drying apparatus according to claim 10, wherein the elevation mechanism further comprises a retractable bellows mounted around the elevation shaft and configured to seal a region connecting the elevation plate with the top of the chamber.

14. The vacuum drying apparatus according to claim 4, wherein the wind deflector elevation driver further comprises an elevation limit mechanism configured to limit an upper limit position and a lower limit position of the wind deflector.

15. The vacuum drying apparatus according to claim 14, wherein the elevation limit mechanism comprises an upper limit position sensor, a lower limit position sensor and a sensor mount, the upper limit position sensor and the lower limit position sensor being fixed to the sensor mount, all of the upper limit position sensor, the lower limit position sensor and a motor being connected with a controller, and wherein the controller is configured to control the work state of the motor on the basis of the signals transmitted from the upper limit position sensor and/or the lower limit position sensor.

16. The vacuum drying apparatus according to claim 2, wherein the side wall of the wind deflector is at an angle less than or equal to 90 degrees with respect to the surface of the substrate table.

17. The vacuum drying apparatus according to claim 1, wherein the wind deflector has a square or circular cross section parallel to the bottom opening.

18. The vacuum drying apparatus according to claim 1, wherein the material is substrate of an OLED display device which has been processed by an ink jet printing, and a layer of ink droplets is formed on the substrate by the ink jet printing.

19. The vacuum drying apparatus according to claim 1, wherein an extraction port is arranged at the bottom of the chamber or a plurality of extraction ports are distributed uniformly or in a predetermined form on the positions corresponding to the wind deflector at the bottom of the chamber.

20. A vacuum drying method for drying material using the vacuum drying apparatus according to claim 1, the method comprising:
providing the material onto the substrate table;
covering the material by the wind deflector, the bottom opening being in tight contact with the substrate table, and leaving a gap between the top opening of the wind deflector and the top of the chamber; and
evacuating the chamber such that a gas flow in the wind deflector is directed from the surface of the substrate table through the top opening of the wind deflector to external of the wind deflector and then out of the chamber.

* * * * *